(12) United States Patent
Montgomery

(10) Patent No.: US 10,818,613 B2
(45) Date of Patent: Oct. 27, 2020

(54) ULTRA-THIN SEMICONDUCTOR COMPONENT FABRICATION USING A DIELECTRIC SKELETON STRUCTURE

(71) Applicant: Infineon Technologies Americas Corp., El Segundo, CA (US)

(72) Inventor: Robert Montgomery, Cardiff (GB)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 16/373,007

(22) Filed: Apr. 2, 2019

(65) Prior Publication Data

US 2019/0229072 A1 Jul. 25, 2019

Related U.S. Application Data

(62) Division of application No. 15/175,263, filed on Jun. 7, 2016, now Pat. No. 10,290,588.

(60) Provisional application No. 62/215,907, filed on Sep. 9, 2015.

(51) Int. Cl.
   *H01L 23/00* (2006.01)
   *H01L 21/78* (2006.01)
   *H01L 23/482* (2006.01)
   *H01L 21/683* (2006.01)

(52) U.S. Cl.
   CPC ........ *H01L 23/562* (2013.01); *H01L 21/6836* (2013.01); *H01L 21/78* (2013.01); *H01L 23/4827* (2013.01); *H01L 2221/68327* (2013.01)

(58) Field of Classification Search
   None
   See application file for complete search history.

(56) References Cited

U.S. PATENT DOCUMENTS

| 5,691,248 | A | 11/1997 | Cronin et al. |
| 5,872,025 | A | 2/1999 | Cronin et al. |
| 7,211,877 | B1 * | 5/2007 | Zandman ............ H01L 21/6835 257/620 |
| 7,374,971 | B2 | 5/2008 | Yuan et al. |
| 8,168,474 | B1 | 5/2012 | Adkisson et al. |

(Continued)

FOREIGN PATENT DOCUMENTS

CN 102931094 A 2/2013

*Primary Examiner* — Khaja Ahmad
(74) *Attorney, Agent, or Firm* — Murphy, Bilak & Homiller, PLLC

(57) ABSTRACT

In one implementation, a method for forming ultra-thin semiconductor components includes fabricating multiple devices including a first device and a second device in a semiconductor wafer, and forming a street trench within the semiconductor wafer and between the first and second devices. The method continues with forming a dielectric skeleton structure over the semiconductor wafer, the dielectric skeleton structure laterally extending to at least partially cover the first and second devices, while also substantially filling the street trench. The method continues with thinning the semiconductor wafer from a backside to expose the dielectric skeleton structure in the street trench to form a first ultra-thin semiconductor component having the first device, and a second ultra-thin semiconductor component having the second device. The method can conclude with cutting through the dielectric skeleton structure to singulate the first and second ultra-thin semiconductor components.

11 Claims, 8 Drawing Sheets

(56) References Cited

U.S. PATENT DOCUMENTS

| | | |
|---|---|---|
| 2005/0121795 A1 | 6/2005 | Mauder |
| 2007/0087524 A1* | 4/2007 | Montgomery .......... H01L 21/78 438/427 |
| 2008/0318396 A1* | 12/2008 | Shin ...................... H01L 21/561 438/462 |
| 2009/0197394 A1* | 8/2009 | Parekh .................... H01L 21/78 438/462 |
| 2010/0319744 A1 | 12/2010 | Smythe et al. |
| 2012/0034760 A1* | 2/2012 | Schuderer ............... H01L 21/78 438/462 |
| 2012/0289047 A1* | 11/2012 | Ahrens ................... H01L 24/03 438/675 |
| 2013/0037917 A1 | 2/2013 | Xue |
| 2016/0204220 A1* | 7/2016 | Wada ................ H01L 29/66068 438/700 |

\* cited by examiner

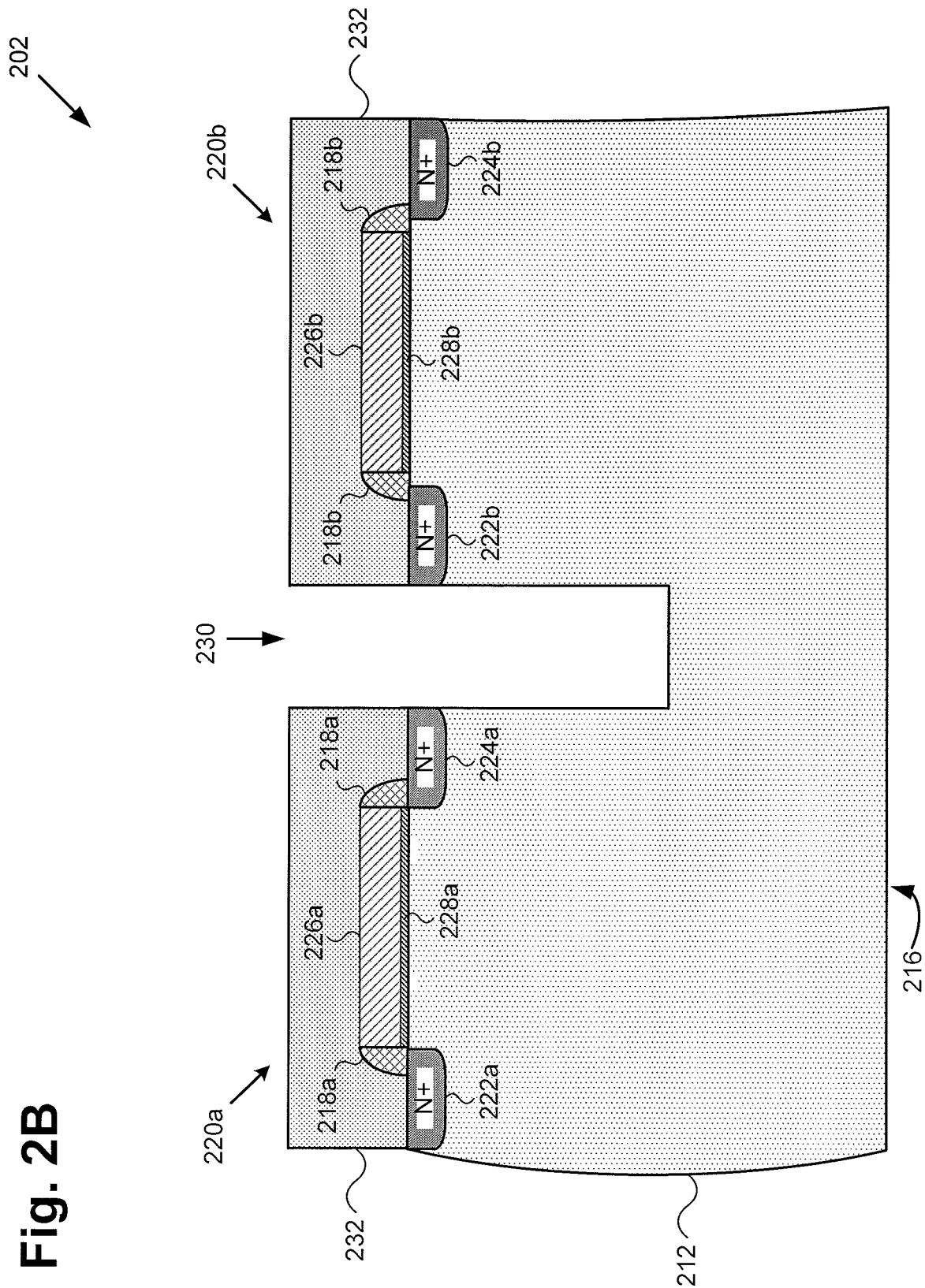

ULTRA-THIN SEMICONDUCTOR
COMPONENT FABRICATION USING A
DIELECTRIC SKELETON STRUCTURE

The present application claims the benefit of and priority to a provisional application entitled "Structure and Method for Thin Die Separation and Support," Ser. No. 62/215,907 filed on Sep. 9, 2015. The disclosure in this provisional application is hereby incorporated fully by reference into the present application.

BACKGROUND

Background Art

Due to the potential advantages resulting from the fabrication of semiconductor devices on thin dies, such as improved electrical performance, for example, efficient and reliable techniques for providing thin and ultra-thin semiconductor dies are desired. However, as known in the art, the production and separation of thin and ultra-thin dies can be challenging because of the susceptibility of those dies to damage. For example, thin and ultra-thin dies may be chipped during sawing and singulation, or may be cracked during singulation and the handling associated with packaging of the dies.

A conventional technique directed to overcoming the challenges involved in producing thin and ultra-thin semiconductor dies includes gluing a semiconductor wafer to a handle substrate before grinding the wafer to thin it, and then mounting the thinned wafer onto dicing tape. The thinned wafer is diced, and then must be unglued from the handle substrate. Unfortunately, this conventional technique, although offering some protection for thin and ultra-thin dies during their production and separation, is undesirably costly and slow.

SUMMARY

The present disclosure is directed to ultra-thin semiconductor component fabrication using a dielectric skeleton structure, substantially as shown in and/or described in connection with at least one of the figures, and as set forth in the claims.

BRIEF DESCRIPTION OF THE DRAWINGS

FIG. 2B shows a cross-sectional view illustrating a result of performing a subsequent action according to the exemplary flowchart of FIG. 1, according to one implementation.

DETAILED DESCRIPTION

Figure 1:
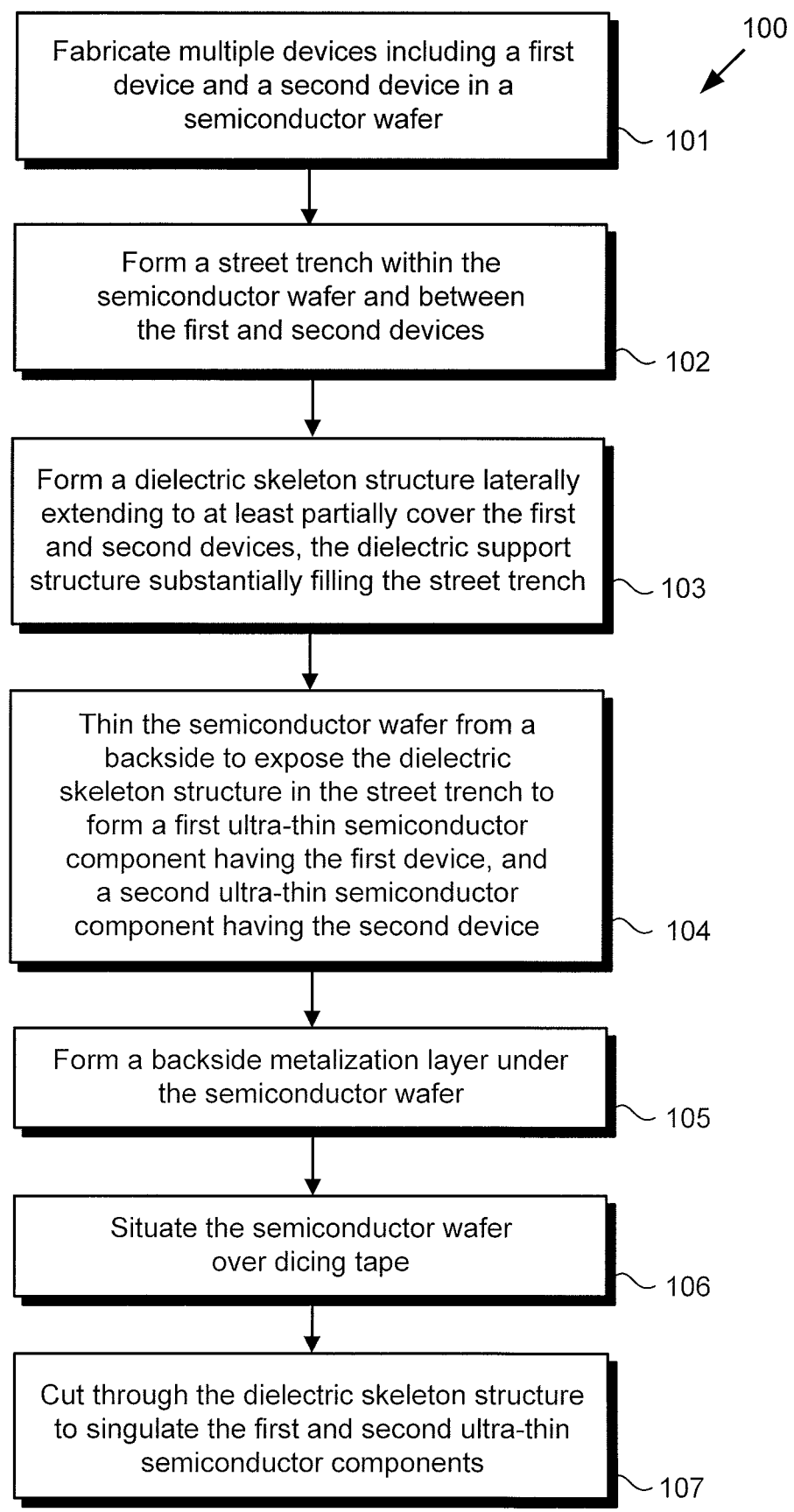
FIG. 1 is a flowchart presenting an exemplary method for fabricating ultra-thin semiconductor components using a dielectric skeleton structure, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

As stated above, due to the potential advantages resulting from the fabrication of semiconductor devices on thin dies, such as improved electrical performance, efficient and reliable techniques for providing thin and ultra-thin semiconductor dies are desired in the art. However, and as known in the art, the production and separation of thin and ultra-thin dies can be challenging because of the susceptibility of those dies to damage. For example, thin and ultra-thin dies may be chipped during sawing and singulation, or may be cracked during singulation and the handling associated with packaging of the dies.

As further stated above, a conventional technique directed to overcoming the challenges involved in producing thin and ultra-thin semiconductor dies includes gluing a semiconductor wafer to a handle substrate before grinding the wafer to thin it, and then mounting the thinned wafer onto dicing tape. The thinned wafer is diced, and then must be unglued from the handle substrate. Unfortunately, this conventional technique, although offering some protection for thin and ultra-thin dies during their production and separation, is undesirably costly and slow.

The present application discloses structures and methods for ultra-thin semiconductor component fabrication using a dielectric skeleton structure. According to the exemplary implementations described in the present application, such a method includes fabricating multiple devices in a semiconductor wafer, and forming street trenches within the wafer between some or all of the semiconductor devices. The method also includes forming a dielectric skeleton structure laterally extending to at least partially cover at least some of the devices while substantially filling the street trenches.

The semiconductor wafer can then be thinned, using the dielectric skeleton structure for mechanical support and stabilization. Thinning proceeds until the dielectric skeleton structure is exposed at the backside of the thinned semiconductor wafer, resulting in formation of multiple ultra-thin semiconductor components each including at least one of the multiple devices fabricated in the wafer. The ultra-thin semiconductor components may then be singulated by cutting through the dielectric skeleton structure, rather than by cutting through the semiconductor material of the wafer itself, thereby advantageously avoiding the wafer chipping and cracking that may occur during conventional thin wafer separation processes.

In contrast to conventional methods in which a semiconductor wafer must typically be unglued from a handle substrate providing mechanical support after the wafer is thinned, the dielectric skeleton structure disclosed in the present application in effect stays with the wafer through singulation of its component dies, which is unique in the art. Moreover, the ultra-thin semiconductor fabrication solution disclosed in the present application requires a minimum amount of new tooling, and advantageously results in faster and less costly processing.

FIG. 1 shows flowchart 100 presenting an exemplary method for fabricating ultra-thin semiconductor components using a dielectric skeleton structure, according to one implementation. The exemplary method described by flowchart 100 is performed on a semiconductor wafer, such as a silicon (Si) or other group IV semiconductor based wafer, and may be utilized to fabricate ultra-thin semiconductor components providing one or more of a variety of device types. For example, the ultra-thin semiconductor components disclosed in the present application may include devices in the form of lateral silicon or other group IV based transistors, vertical power transistors such as vertical power field-effect transistors (FETs), insulated-gate bipolar transistors (IGBTs), and diodes, to name a few examples.

Figure 2A:
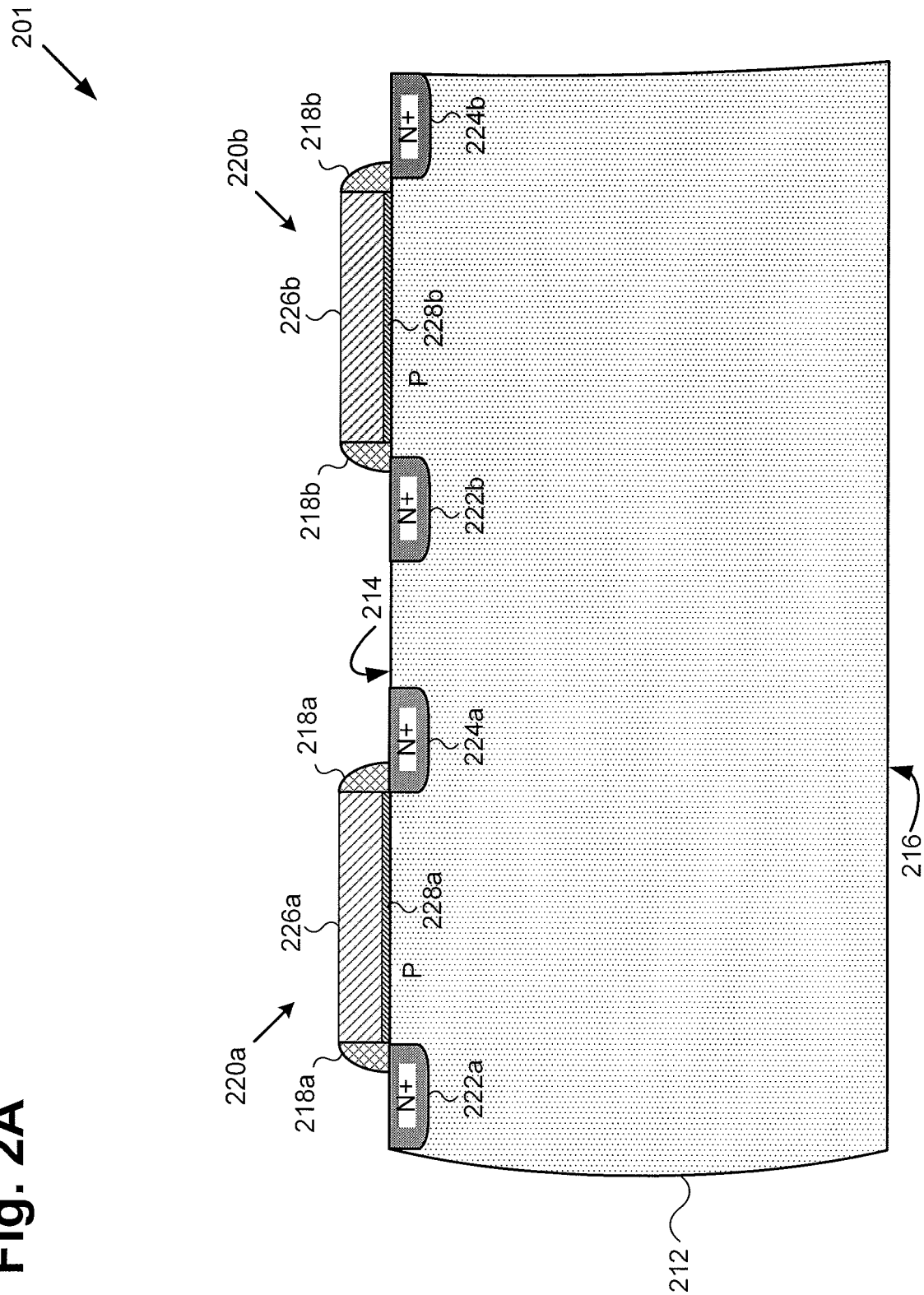
FIG. 2A shows a cross-sectional view illustrating a result of performing an initial action according to the exemplary flowchart of FIG. 1, according to one implementation.
Figure 2C:
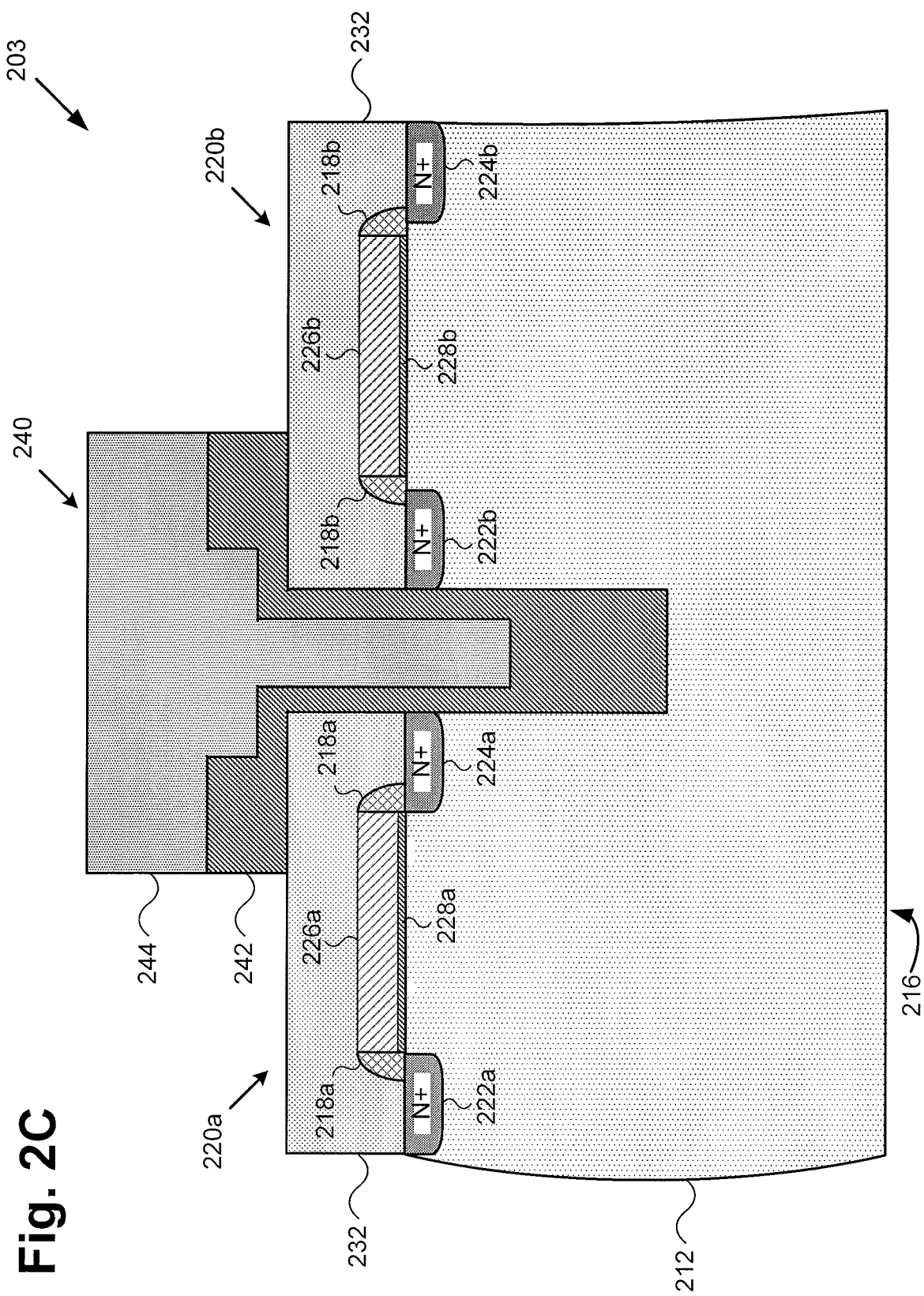
FIG. 2C shows a cross-sectional view illustrating a result of performing a subsequent action according to the exemplary flowchart of FIG. 1, according to one implementation.

With respect to FIGS. 2A, 2B, 2C, 2D, 2E, 2F, and 2G (hereinafter "FIGS. 2A-2G"), structures 201, 202, 203, 204, 205, 206, and 207 shown respectively in those figures illustrate the result of performing the method of flowchart 100, according to one implementation. For example, structure 201, shown in cross-section in FIG. 2A, represents a portion of semiconductor wafer 212 having first and second devices 220a and 220b fabricated therein (action 101). Structure 202, shown in cross-section in FIG. 2B shows formation of street trench 230 within semiconductor wafer 212 between devices 220a and 220b (action 102). Structure 203, shown in cross-section in FIG. 2C, shows formation of dielectric skeleton structure 240 (action 103), and so forth.

Referring to flowchart 100, in FIG. 1, in combination with FIG. 2A, flowchart 100 begins with fabricating multiple devices including first device 220a and second device 220b in semiconductor wafer 212 (action 101). As shown by structure 201 in FIG. 2A, semiconductor wafer 212 includes first device 220a and second device 220b fabricated in and over device side 214 of semiconductor wafer 212. In addition, semiconductor wafer 212 includes highly doped N type drains 222a and 222b of respective first and second devices 220a and 220b, and highly doped N type sources 224a and 224b of respective first and second devices 220a and 220b, formed in device side 214.

As further shown by structure 201, gate 226a of first device 220a, which includes gate dielectric 228a, and gate 226b of second device 220b, which includes gate dielectric 228b, are situated over device side 214 of semiconductor die 212. It is noted that highly doped drain 222a is separated from highly doped source 224a by a P type body region of first device 220a extending under gate 226a. Similarly, highly doped drain 222b is separated from highly doped source 224b by a P type body region of second device 220b extending under gate 226b. Also shown in FIG. 2A are spacers 218a situated over device side 214 and adjoining gate 226a, spacers 218b also situated over device side 214 but adjoining gate 226b, and backside 216 of semiconductor wafer 212 opposite device side 214.

Semiconductor wafer 212 may include a group IV based substrate, such as a silicon substrate or a silicon carbide (SiC) substrate, for example. Moreover, in some implementations, first and second devices 220a and 220b may be fabricated in an epitaxial silicon or other epitaxial group IV layer included as part of semiconductor wafer 212 (epitaxial layer not explicitly shown in FIGS. 2A-2G). Formation of such an epitaxial layer may be performed by any suitable method, as known in the art, such as chemical vapor deposition (CVD) or molecular beam epitaxy (MBE), for example. In addition, in some implementations, semiconductor wafer 212 may further include a strained or unstrained germanium (Ge) layer (also not explicitly shown in FIGS. 2A-2G). Thus, first and second devices 220a and 220b may be implemented as silicon or other group IV semiconductor devices.

Highly doped N type drains 222a and 222b and highly doped N type sources 224a and 224b may be formed by implantation and thermal diffusion of a suitable N type dopant in device side 214 of semiconductor wafer 212. Such a suitable N type dopant may include arsenic (As) or phosphorous (P), for example.

Gates 226a and 226b may be formed using any materials typically utilized in the art. For example, gates 226a and 226b may include respective conductive gate electrodes formed of doped polysilicon or metal. Gate dielectrics 228a and 228b may be formed using any material and any technique typically employed in the art. For example, gate dielectrics 228a and 228b may be formed of silicon dioxide ($SiO_2$), and may be deposited or thermally grown to produce gate dielectrics 228a and 228b. Spacers 218a and 218b may analogously be formed using any material and any technique employed in the art. For example, spacers 218a and 218b may be formed of silicon nitride ($Si_3N_4$), and may be deposited and etched as known in the art.

It is noted that although the implementation shown in FIGS. 2A-2G depict first and second devices 220a and 220b as n-channel lateral FETs (NFETs), that representation is merely exemplary. In other implementations, the described polarities of highly doped N type drains 222a and 222b, highly doped N type sources 224a and 224b, and the P type body regions separating those drains and sources may be reversed. In those implementations, one or both of first and second devices 220a and 220b may be implemented as p-channel FETs (PFETs).

It is further noted that in the interests of ease and conciseness of description, the present inventive principles will in some instances be described by reference to specific implementations of a silicon based lateral FET. However, it is emphasized that such implementations are merely exemplary, and the inventive principles disclosed herein are broadly applicable for use with a wide variety of device types. For example, in other implementations, first and second devices 220a and 220b may take the form of vertical power FETs, such as vertical power metal-oxide-semiconductor FETs (MOSFETs), or may take the form of IGBTs or diodes.

Moving to FIG. 2B with continued reference to flowchart 100, in FIG. 1, flowchart 100 continues with forming street trench 230 within semiconductor wafer 212 and between first and second devices 220a and 220b (action 102). For example, and as shown by structure 202, street trench 230 may be formed by first forming mask layer 232 over first and second devices 220a and 220b. Mask layer 232, which may be a photoresist layer, for example, may then be etched or otherwise patterned to enable formation of street trench 230 in device side 214 of semiconductor wafer 212, between first and second devices 220a and 220b.

Street trench 230 may be etched or otherwise patterned in semiconductor wafer 212 to form a deep street trench. For example, street trench 230 may be formed to a depth of approximately eighty micrometers (80 µm), or greater, in semiconductor wafer 212.

It is noted that the features identified by the same reference numbers in FIGS. 2A-2G correspond respectively to one another and may share any of the characteristics attributed to them by reference to any individual figure of the present application. In other words, semiconductor wafer 212, and first and second devices 220a and 220b, in FIGS. 2B-2G, correspond respectively to semiconductor wafer 212, and first and second devices 220a and 220b, in FIG. 2A, and may share any of the characteristics attributed to those corresponding features in the present application.

Moving now to FIG. 2C, with continued reference to flowchart 100, in FIG. 1, flowchart 100 continues with forming dielectric skeleton structure 240 over semiconductor wafer 212, dielectric skeleton structure 240 laterally extending to at least partially cover first and second devices 220a and 220b, and substantially filling street trench 230 (action 103). As shown by structure 203, in some implementations, dielectric skeleton structure 240 may be include first dielectric material 242, and second dielectric material 244 formed over first dielectric material 242. For example, first dielectric material 242 may be one of silicon dioxide or silicon nitride, for example, while second dielectric material may be the other of silicon dioxide or silicon nitride.

It is noted, however, that the use of two dielectric materials to form dielectric skeleton structure 240 is merely exemplary. In some implementations, dielectric skeleton structure 240 may be formed of a single dielectric material, such as one of silicon dioxide or silicon nitride, but not the other. Moreover, in some implementations, dielectric skeleton structure 240 may include more than two dielectric materials.

According to the exemplary implementation shown in FIG. 2C, dielectric skeleton structure 240 may be formed by first depositing a blanket layer of first dielectric material 242 over device side 214 of semiconductor wafer 212 so as to at least partially fill street trench 230. The blanket layer of first dielectric material 242 may be partially or fully patterned, and another blanket layer of second dielectric material 244 may be deposited over first dielectric material 242. Patterning of first and second dielectric materials 242 and 244 results in formation of dielectric skeleton structure 240.

As shown in FIG. 2C, according to the present exemplary implementation, dielectric skeleton structure 240 extends laterally to cover source 224a, one of spacers 218a, and a portion of gate 226a of first device 220a, as well as to cover drain 222b, one of spacers 218b, and a portion of gate 226b of second device 220b. In addition, and as further shown in FIG. 2C, dielectric skeleton structure 240 substantially fills street trench 230.

Figure 2D:
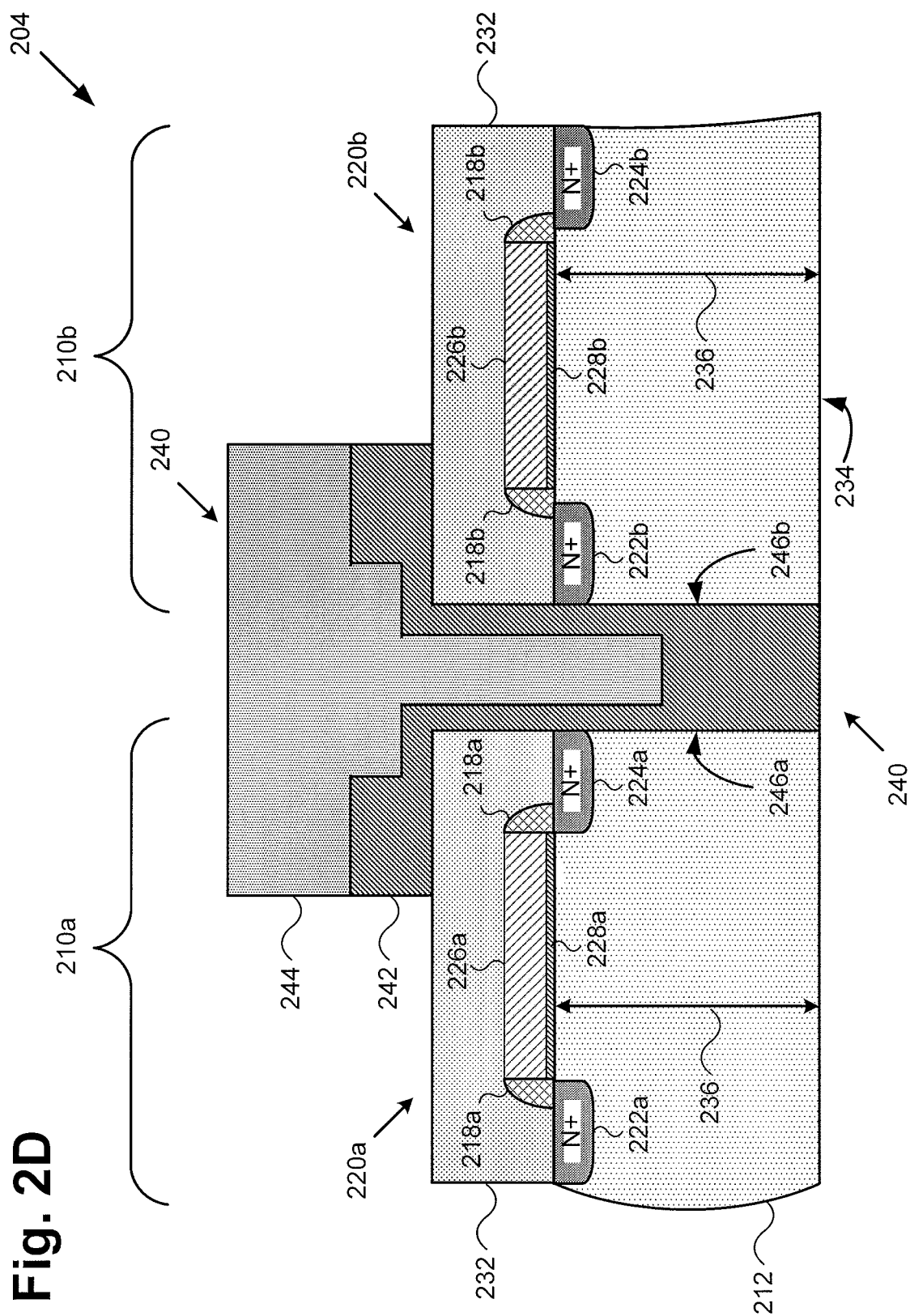
FIG. 2D shows a cross-sectional view illustrating a result of performing a subsequent action according to the exemplary flowchart of FIG. 1, according to one implementation.

Referring to structure 204 in FIG. 2D, flowchart 100 continues with thinning semiconductor wafer 212 from backside 216 to expose dielectric skeleton structure 240 in street trench 230 to form first ultra-thin semiconductor component 210a having first device 220a, and second ultra-thin semiconductor component 210b having second device 220b (action 104). Semiconductor wafer 212 may be thinned by etching or backgrinding semiconductor wafer 212 from backside 216 to expose dielectric skeleton structure 240 at back surface 234 of thinned semiconductor wafer 212.

As a result, semiconductor wafer 212 may have thickness 236 less than or approximately equal to the depth to which street trench 230 was formed in action 102. That is to say, thickness 236 of wafer 212 after thinning may be less than or approximately equal to 80 μm. For example, thickness 236 may be a thickness in a range from approximately 65 μm to approximately 75 μm, or may be a thickness of less than 65 μm. As noted above, dielectric skeleton structure 240 can be used to provide mechanical support and stability for semiconductor wafer 212 during thinning.

As shown by structure 204, first ultra-thin semiconductor component 210a has sidewall 246a adjoined by dielectric skeleton structure 240, and second ultra-thin semiconductor component 210b has sidewall 246b adjoined by dielectric skeleton structure 240. Moreover, and as further shown by structure 204, in addition to laterally extending to at least partially cover first and second devices 220a and 220b, dielectric skeleton structure 240 substantially covers each of sidewall 246a of first ultra-thin semiconductor component 210a and sidewall 246b of second ultra-thin semiconductor component 210b.

Figure 2E:
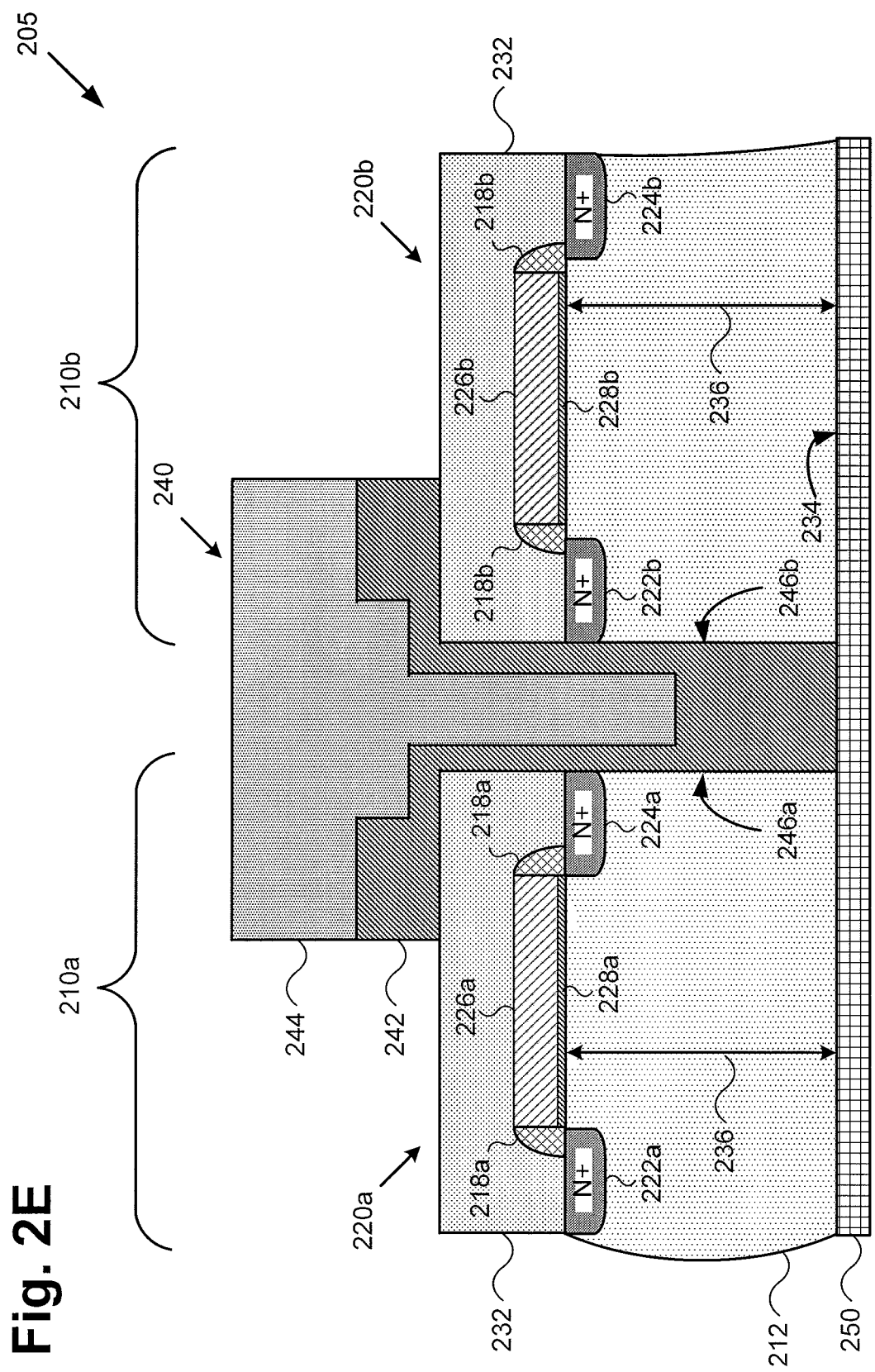
FIG. 2E shows a cross-sectional view illustrating a result of performing a subsequent action according to the exemplary flowchart of FIG. 1, according to one implementation.

Referring to FIG. 2E, flowchart 100 continues with forming backside metalization layer 250 under semiconductor wafer 212 (action 105). As shown by structure 205, metalization layer 250 may be formed so as to substantially cover back surface 234 of semiconductor wafer 212. Metalization layer 250 may be formed of aluminum (Al) or copper (Cu), for example, using any technique known in the conventional art.

Figure 2F:
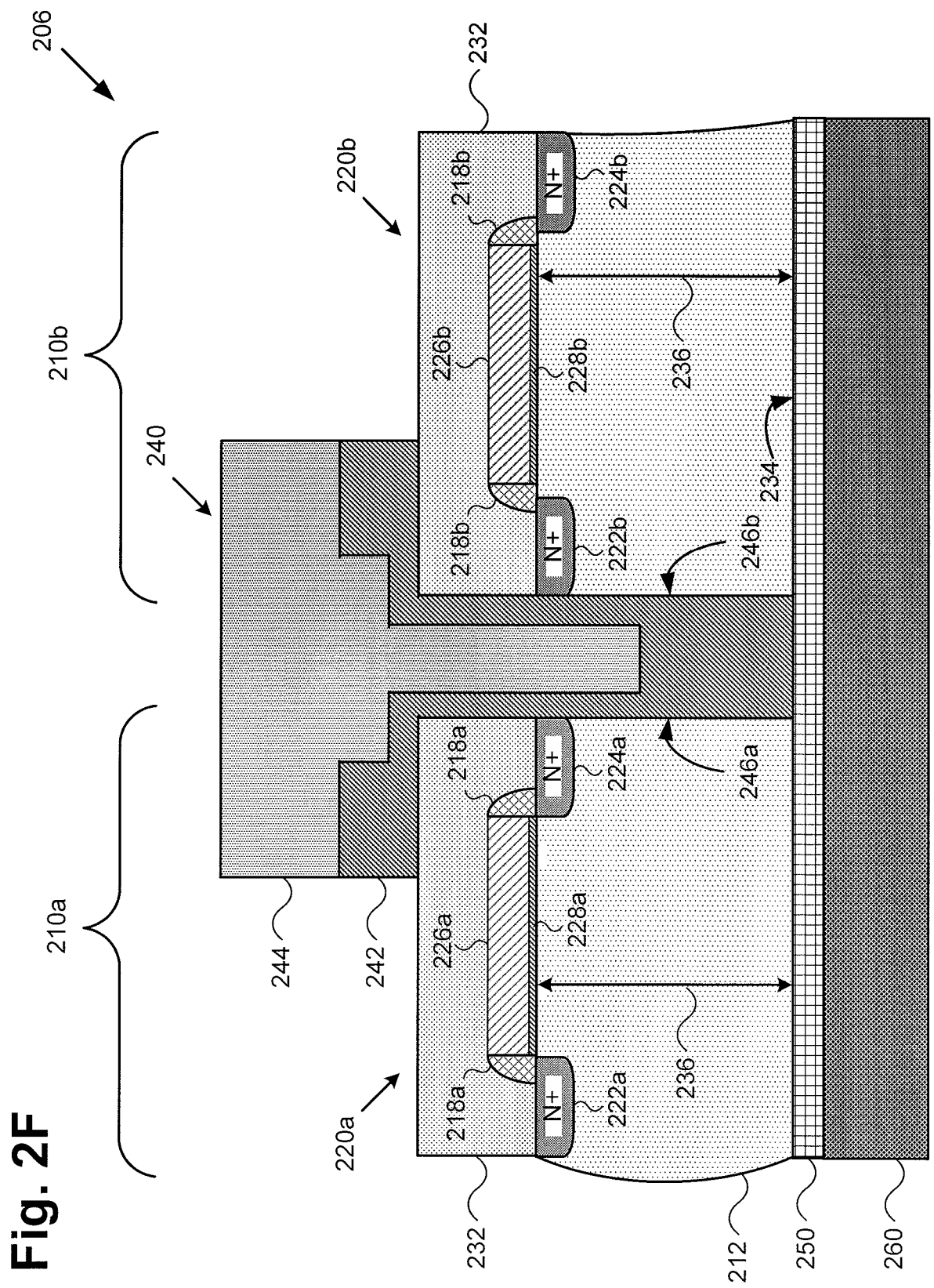
FIG. 2F shows a cross-sectional view illustrating a result of performing a subsequent action according to the exemplary flowchart of FIG. 1, according to one implementation.

Moving to FIG. 2F, flowchart 100 continues with situating semiconductor wafer 212 over dicing tape 260 (action 106). As shown by structure 206, semiconductor wafer 212 is situated over dicing tape 260 such that metalization layer 250 covering back surface 234 of semiconductor wafer 212 is in contact with dicing tape 260. Dicing tape 260 may be formed of any material typically used as dicing tape in the art, such polyethylene or polyvinyl chloride (PVC), for example.

Figure 2G:
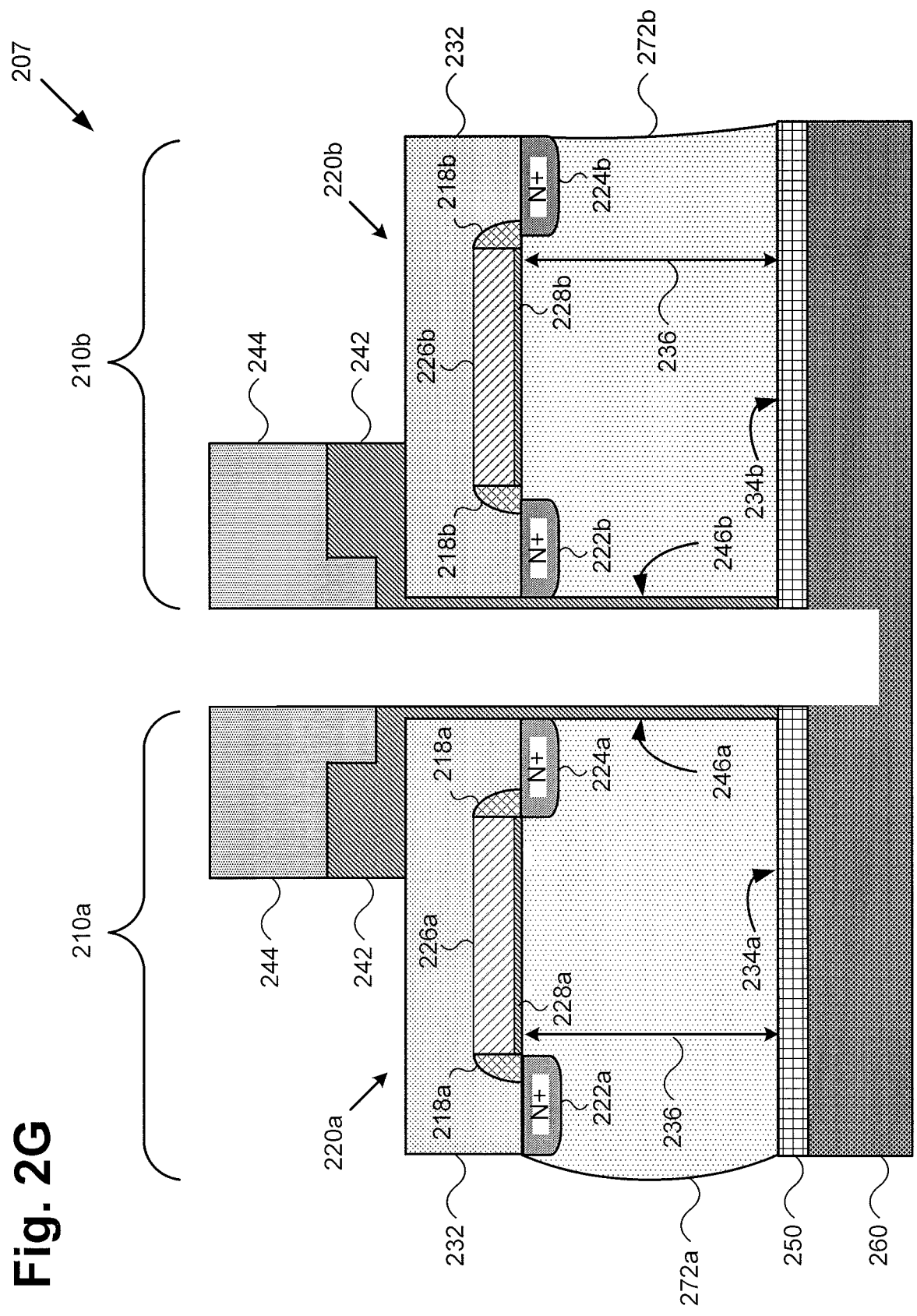
FIG. 2G shows a cross-sectional view illustrating a result of performing a final action according to the exemplary flowchart of FIG. 1, according to one implementation.

Continuing to FIG. 2G, flowchart 100 can conclude with cutting through dielectric skeleton structure 240 to singulate first and second ultra-thin semiconductor components 210a and 210b (action 107). As a result of that singulation, die 272a of first ultra thin semiconductor component 210a is mechanically separated from die 272b of second ultra-thin semiconductor components 210b, as shown by structure 207. It is noted that, according to implementations of the present inventive concepts, first and second ultra-thin semiconductor components 210a and 210b are singulated by cutting through dielectric skeleton structure 240, rather than by cutting through semiconductor wafer 212 itself, thereby advantageously preventing chipping or cracking of dies 272a and 272b during singulation.

It is further noted that each of dies 272a and 272b is an ultra-thin die having thickness 236. As noted above by reference to thickness 236 after thinning of wafer 212 in action 104, thickness 236 may be less than or approximately equal to 80 μm. For example, thickness 236 may be a thickness in a range from approximately 65 μm to approximately 75 μm, or may be a thickness of less than 65 μm.

Thus, the present application discloses use of a dielectric skeleton structure during fabrication of ultra-thin semiconductor components. The dielectric skeleton structure provides mechanical support and stabilization for a semiconductor wafer having multiple devices fabricated therein during thinning of the wafer. Ultra-thin semiconductor components including the devices fabricated in the wafer may be singulated by cutting through the dielectric skeleton structure, rather than by cutting through the semiconductor material of the wafer itself. As a result, the ultra-thin semiconductor fabrication solution disclosed in the present application advantageously reduces or substantially eliminates the wafer chipping and cracking that may occur in conventional thin wafer separation processes. Moreover, the ultra-thin semiconductor fabrication solution disclosed in the present application requires a minimum amount of new tooling, and advantageously results in faster and less costly processing.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A semiconductor wafer, comprising:
a first ultra-thin semiconductor component having a first device;
a second ultra-thin semiconductor component having a second device;
a dielectric skeleton structure laterally extending to at least partially cover said first and second devices, said dielectric skeleton structure substantially covering a first sidewall of said first ultra-thin semiconductor component and a second sidewall of said second ultra-thin semiconductor component; and
a backside metalization layer situated under said semiconductor wafer,
wherein the first and second devices are active devices, wherein the dielectric skeleton structure covers a first doped active region and partially covers a gate structure of said first and second active devices and exposes a second doped active region of said first and second active devices,
wherein the first and second devices each comprise an electrically insulating mask layer that is formed around the gate structure of said first and second active devices, respectively, and wherein for each of the first and second devices, an upper surface region of the electrically insulating mask layer that is laterally adjacent to the dielectric skeleton structure is completely exposed.

2. The semiconductor wafer of claim 1, wherein said dielectric skeleton structure comprises a first dielectric material and a second dielectric material formed over said first dielectric material.

3. The semiconductor wafer of claim 1, wherein said dielectric skeleton structure comprises at least one of silicon dioxide and silicon nitride.

4. The semiconductor wafer of claim 1, wherein respective semiconductor dies of said first and second ultra-thin semiconductor components have a thickness of less than approximately 80 μm.

5. The semiconductor wafer of claim 1, wherein said first and second devices are group IV semiconductor devices.

6. The semiconductor wafer of claim 1, wherein said first and second devices are silicon devices.

7. The semiconductor wafer of claim 1, wherein at least one of said first and second devices comprises a lateral transistor.

8. The semiconductor wafer of claim 1, wherein at least one of said first and second devices comprises a vertical power field-effect transistor (FET).

9. The semiconductor wafer of claim 1, wherein at least one of said first and second devices comprises an insulated-gate bipolar transistor (IGBT).

10. The semiconductor wafer of claim 1, wherein at least one of said first and second devices comprises a diode.

11. The semiconductor wafer of claim 1, further comprising a street trench within said semiconductor wafer and between said first and second active devices, wherein said dielectric skeleton structure fills said street trench such that said street trench is completely filled by dielectric material, wherein said dielectric skeleton structure in said street trench is exposed from a backside of said semiconductor wafer to form a first ultra-thin semiconductor component having said first device, and a second ultra-thin semiconductor component having said second device.

* * * * *